United States Patent
Seo et al.

(10) Patent No.: US 9,846,542 B2
(45) Date of Patent: Dec. 19, 2017

(54) STORAGE CONTROLLER, STORAGE DEVICE, STORAGE SYSTEM AND METHOD OF OPERATING THE STORAGE CONTROLLER

(71) Applicants: Jung-Min Seo, Seongnam-si (KR); Ju-Pyung Lee, Suwon-si (KR)

(72) Inventors: Jung-Min Seo, Seongnam-si (KR); Ju-Pyung Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 386 days.

(21) Appl. No.: 14/682,200

(22) Filed: Apr. 9, 2015

(65) Prior Publication Data

US 2015/0293713 A1 Oct. 15, 2015

(30) Foreign Application Priority Data

Apr. 15, 2014 (KR) .................. 10-2014-0044809

(51) Int. Cl.
- *G06F 3/06* (2006.01)
- *G06F 12/02* (2006.01)
- *G11C 16/34* (2006.01)

(52) U.S. Cl.
CPC .......... *G06F 3/0616* (2013.01); *G06F 3/0652* (2013.01); *G06F 3/0655* (2013.01); *G06F 3/0679* (2013.01); *G06F 12/0246* (2013.01); *G11C 16/349* (2013.01); *G06F 2206/1014* (2013.01); *G06F 2212/7205* (2013.01); *G06F 2212/7211* (2013.01)

(58) Field of Classification Search
CPC .... G06F 3/0616; G06F 3/0652; G06F 3/0655; G06F 3/0679; G06F 12/0246; G06F 12/0253; G11C 16/349

USPC ............ 711/103, 154, 156, 158; 365/185.33; 707/639, 649, 813, 814, 819
See application file for complete search history.

(56) References Cited

U.S. PATENT DOCUMENTS

| | | | |
|---|---|---|---|
| 6,715,027 | B2 | 3/2004 | Kim et al. |
| 6,903,972 | B2 * | 6/2005 | Lasser ................. G11C 11/5628 365/185.18 |
| 8,090,905 | B2 | 1/2012 | Stenfort |
| 8,095,765 | B2 | 1/2012 | Asnaashari et al. |

(Continued)

FOREIGN PATENT DOCUMENTS

| | | |
|---|---|---|
| KR | 1020020054255 A | 7/2002 |
| KR | 2011-0124395 A | 11/2011 |

(Continued)

OTHER PUBLICATIONS

Search Report dated October 1, 2015 From Corresponding European Application No. 15163662.8-1805.

*Primary Examiner* — Stephen Elmore
(74) *Attorney, Agent, or Firm* — Volentine & Whitt, PLLC

(57) ABSTRACT

A storage controller that improves performance of a storage device by reducing the number of data I/O operations. The storage controller, as part of a storage device and a storage system, and in a method of operating the storage controller, includes a host interface receiving data requested for storage from a host and lifetime information indicating a change period of the data, and a data placement manager determining a storage position of the data in a flash memory based on the lifetime information of the data.

27 Claims, 23 Drawing Sheets

(56) References Cited

U.S. PATENT DOCUMENTS

| | | | |
|---|---|---|---|
| 8,402,242 B2* | 3/2013 | Hu | G06F 12/0246 711/165 |
| 8,644,099 B2* | 2/2014 | Cometti | G11C 16/10 365/185.18 |
| 8,737,136 B2* | 5/2014 | Cometti | G11C 16/10 365/185.18 |
| 8,832,234 B1* | 9/2014 | Brooker | G06F 17/30194 709/216 |
| 8,918,392 B1* | 12/2014 | Brooker | G06F 17/30159 370/355 |
| 8,930,364 B1* | 1/2015 | Brooker | G06F 17/30017 707/736 |
| 8,935,203 B1* | 1/2015 | Brooker | G06F 13/28 707/610 |
| 9,223,655 B2* | 12/2015 | Sugimoto | G06F 11/1096 |
| 9,776,673 B2* | 10/2017 | Hu | G06F 12/0246 |
| 2008/0215800 A1 | 9/2008 | Lee et al. | |
| 2010/0030948 A1 | 2/2010 | Moon et al. | |
| 2010/0125767 A1 | 5/2010 | Zeng | |
| 2012/0084504 A1* | 4/2012 | Colgrove | G06F 3/0605 711/114 |
| 2012/0084506 A1* | 4/2012 | Colgrove | G06F 11/1076 711/114 |
| 2012/0110249 A1 | 5/2012 | Jeong et al. | |
| 2012/0236656 A1* | 9/2012 | Cometti | G11C 16/26 365/185.22 |
| 2012/0239976 A1* | 9/2012 | Cometti | G11C 16/26 714/24 |
| 2012/0317337 A1* | 12/2012 | Johar | G06F 12/0246 711/103 |
| 2013/0111112 A1* | 5/2013 | Jeong | G11C 16/349 711/103 |
| 2013/0173844 A1 | 7/2013 | Chen et al. | |

FOREIGN PATENT DOCUMENTS

| | | |
|---|---|---|
| KR | 20110135117 A | 12/2011 |
| KR | 2012-0045421 A | 5/2012 |

* cited by examiner

FIG. 10

| Block No. | Lifetime | Data |
|---|---|---|
| 1 | 1 | 11001100 |
| 1 | 1 | 01010111 |
| 1 | 1 | 10111111 |
| 1 | 1 | 10101101 |
| 2 | 4 | 10100000 |
| 2 | 3 | 11111110 |
| 2 | 3 | 01011100 |
| 2 | 4 | 00000101 |

| Block No. | Lifetime | Data |
|---|---|---|
| 3 | 0 | 10100011 |
| 3 | 0 | 11111111 |
| 3 | 0 | 01010101 |
| 3 | 0 | 00011100 |
| 4 | 9 | 00000010 |
| 4 | 9 | 11111100 |
| 4 | 9 | 11101110 |
| 4 | 8 | 11010101 |

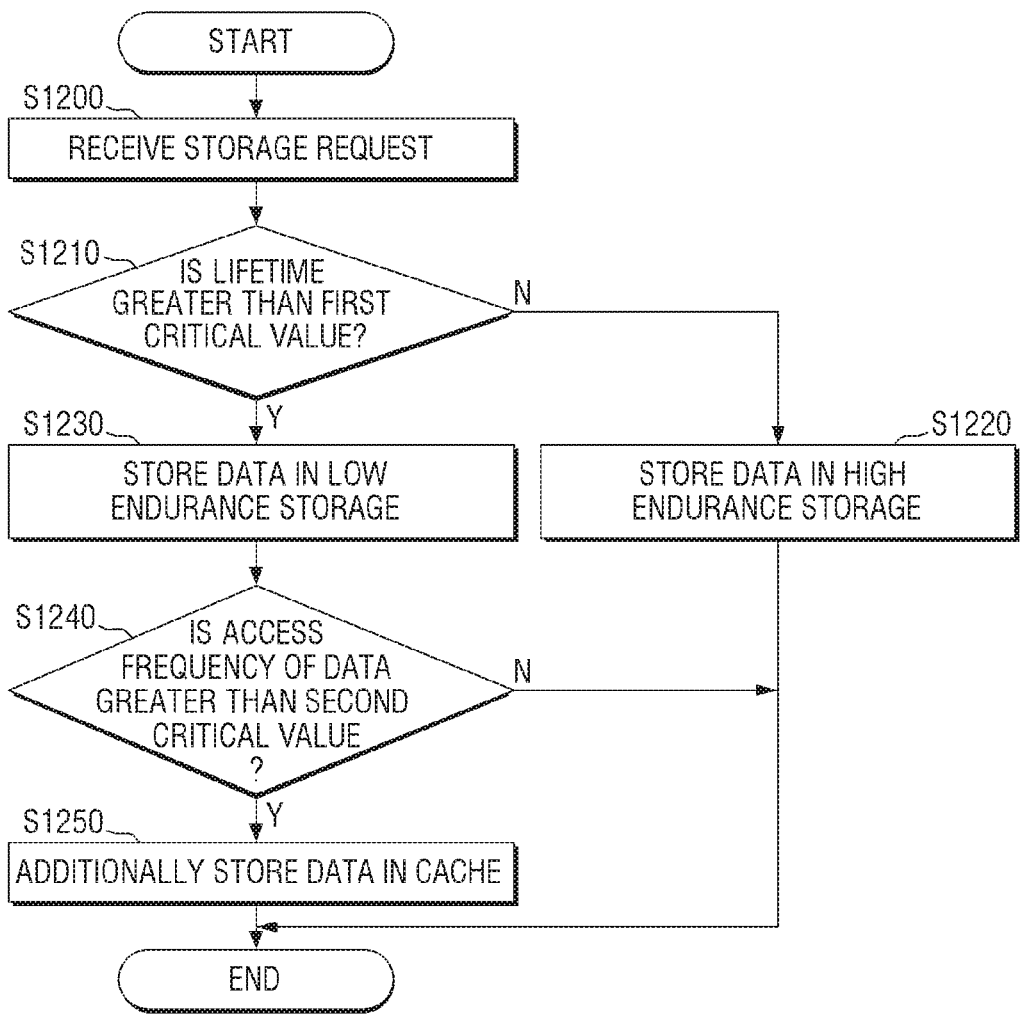

STORAGE CONTROLLER, STORAGE DEVICE, STORAGE SYSTEM AND METHOD OF OPERATING THE STORAGE CONTROLLER

CROSS-REFERENCE TO RELATED APPLICATION

This application claims priority from Korean Patent Application No. 10-2014-0044809 filed on Apr. 15, 2014 in the Korean Intellectual Property Office, and all the benefits accruing therefrom under 35 U.S.C. 119, the contents of which in its entirety are herein incorporated by reference.

BACKGROUND

1. Field of the Inventive concept

The present inventive concept relates to a storage controller, a storage device, a storage system and a method of operating the storage controller.

2. Description of the Related Art

A flash memory device, e.g., a solid state drive (SSD), includes a control logic that converts a logical block address (LBA) into a physical block address (PBA) according to a data input/output (I/O) request, and operates write, read, and erase operations. The controller logic performs the operations using a flash translation layer (FTL). The SSD is an integrated circuit for storing data and has an array of semiconductor memory cells. Accordingly, the SSD operates in a different manner from a hard disk drive (HDD) in which a disk-shaped platter rotates. For example, in the SSD, erase operations are performed on a flash memory block basis. Here, the number of erase operations is directly connected to the lifetime of a flash memory block, consequently affecting the lifetime of the SSD. In other words, since the number of erase operations, that is, the number of input/output (I/O) operations, for a flash memory block in an SSD, is limited, various attempts should be made to extend the lifetime of the SSD.

SUMMARY

The present inventive concept provides a storage controller for improving performance of a storage device by reducing or minimizing the number of data I/O operations.

The present inventive concept also provides a storage device with improved performance by reducing or minimizing the number of data I/O operations.

The present inventive concept also provides a storage system for improving performance of a storage device by reducing or minimizing the number of data I/O operations.

The present inventive concept also provides a method of operating a storage controller for improving performance of a storage device by reducing or minimizing the number of data I/O operations.

These and other objects of the present inventive concept will be described in or be apparent from the following description of the preferred embodiments.

According to an aspect of the present inventive concept, there is provided a storage controller including a host interface receiving data requested for storage from a host and lifetime information indicating a change period of the data, and a data placement manager determining a storage position of the data in a flash memory based on the lifetime information of the data.

According to another aspect of the present inventive concept, there is provided a storage device including a flash memory including a single level cell (SLC) memory module and a multiple level cell (MLC) memory module, a flash memory interface interfacing with the flash memory, a host interface receiving data requested for storage from a host and lifetime information indicating a change period of the data, and a data placement manager determining a storage position of the data in a flash memory from the SLC memory module and the MLC memory module based on the lifetime information of the data.

According to still another aspect of the present inventive concept, there is provided a storage system including a plurality of storage devices, and a controller controlling the plurality of storage devices, wherein the controller comprises a host interface receiving data requested for storage from a host and lifetime information indicating a change period of the data, and a data placement manager determining a storage position of the data in a flash memory among the plurality of storage devices based on the lifetime information of the data.

According to a further aspect of the present inventive concept, there is provided a method of operating a storage controller, the method including receiving data requested for storage from a host and lifetime information indicating a change period of the data, and determining a storage position of the data in a flash memory based on the lifetime information of the data.

BRIEF DESCRIPTION OF THE DRAWINGS

The above and other features and advantages of the present inventive concept will become more apparent by describing in detail preferred embodiments thereof with reference to the attached drawings in which:

FIG. 10 illustrates how data pieces are placed in blocks of a flash memory according to lifetimes in the same or substantially the same range;

FIG. 23 is a flowchart for explaining a method of operating a storage controller according to still another embodiment of the present inventive concept.

DETAILED DESCRIPTION OF THE EMBODIMENTS

Figure 1:
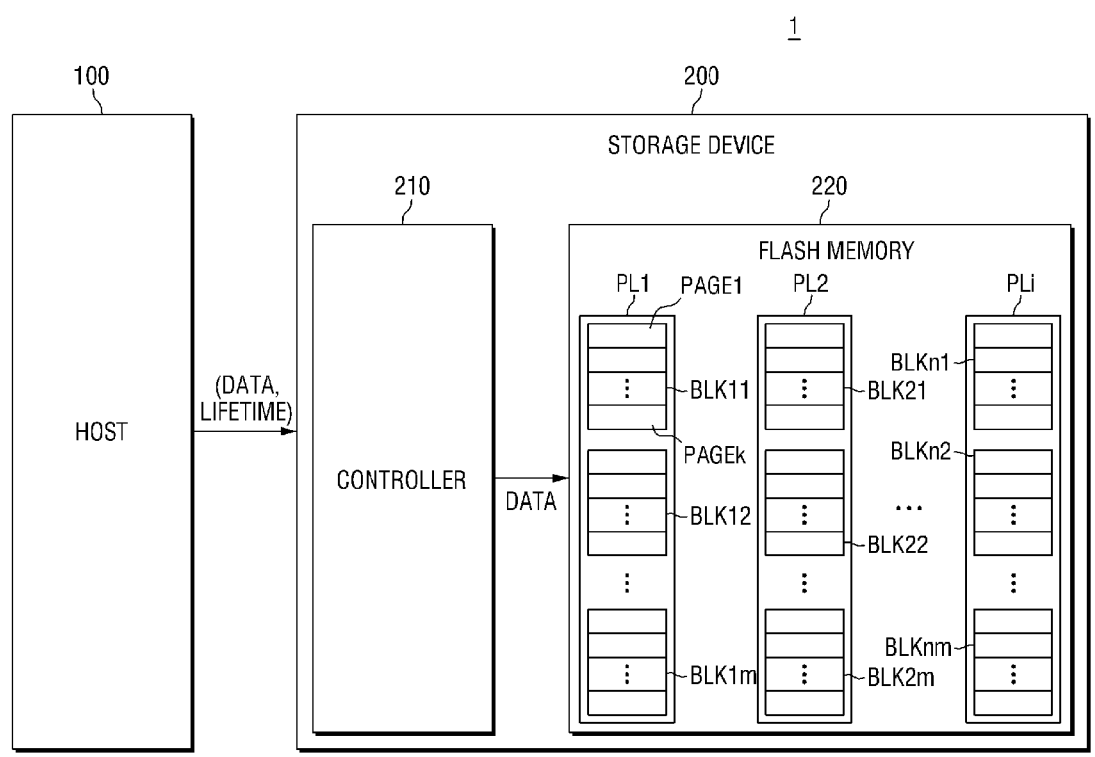
FIG. 1 is a schematic diagram of a data storage system according to an embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a schematic diagram of a data storage system according to an embodiment of the present inventive concept. Referring to FIG. 1, the data storage system 1 includes a host 100 and a storage device 200. The host 100 transmits a data I/O request to the storage device 200. The data I/O request may include data I/O commands, such as write, read and erase operations. The host 100 may receive the data I/O commands for the storage device 200 from a user or software run by the host 100. In some embodiments of the present inventive concept, the host 100 may include, for example, a personal computer including a desktop computer, a server computer, a portable computer including a notebook computer, and portable devices including a cellular phone, a smart phone, a tablet, MP3, a portable multimedia player (PMP), a personal digital assistant (PDA), a digital camera, a camcorder, and so on.

The storage device 200 includes a controller 210 and a flash memory 220. In some embodiments of the present inventive concept, the storage device 200 may be a solid state drive (SSD). The controller 210 controls the overall operation of the flash memory 220. The flash memory 220 may perform a data I/O operation, for example, a write, read or erase operation, under the control of the controller 210.

The flash memory 220 may store the data received from the controller 210 in a memory cell. In detail, the flash memory 220 may include an array of a plurality of cells storing data. The cell array may include a plurality of planes PL1 to PLi, where i is a natural number. The planes PL1 to PLi include a plurality of blocks BLK11 to BLnm, where n and m are natural numbers, and the blocks BLK11 to BLKnm include a plurality of pages PAGE1 to PAGEk, where k is a natural number. An erase command may be executed with blocks BLK11 to BLKnm as a unit, that is, erase operations may be concurrently performed with blocks BLK11 to BLKnm as a unit. Program and read commands may be executed with pages PAGE1 to PAGEk as a unit, that is, program and read operations may be concurrently performed with pages PAGE1 to PAGEk as a unit. In some embodiments of the present inventive concept, the flash memory 220 may be a nonvolatile memory device including an electrically erasable programmable read-only memory (EEPROM), a ferroelectric random access memory (FRAM), a phase-change random access memory (PRAM), and a magnetic random access memory (MRAM). A NAND flash memory is illustrated in FIG. 1 by way of example, but aspects of the present inventive concept are not limited thereto.

Figure 2:
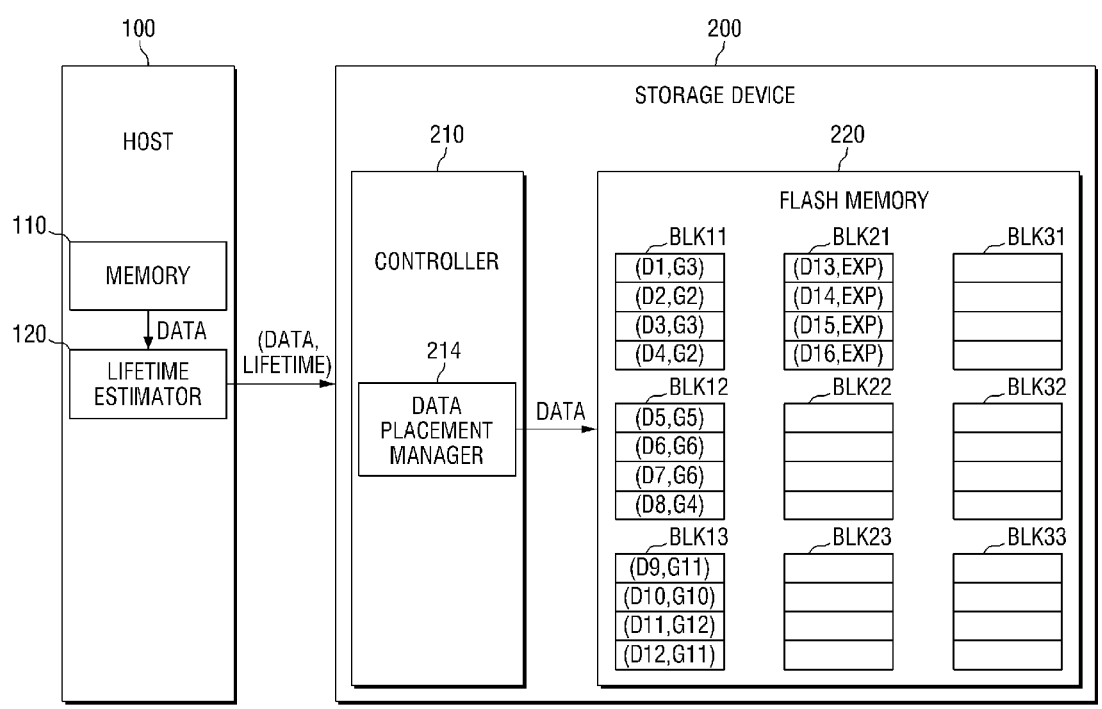
FIG. 2 is a schematic diagram of a data storage system according to another embodiment of the present inventive concept.
Figure 3:
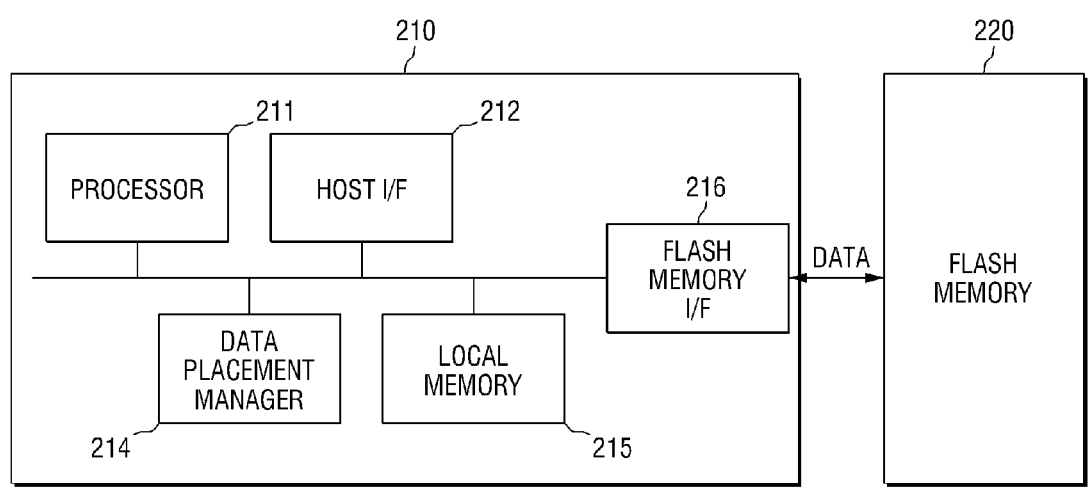
FIG. 3 is a schematic diagram of a controller shown in FIG. 2.

FIG. 2 is a schematic diagram of a data storage system according to another embodiment of the present inventive concept and FIG. 3 is a schematic diagram of a controller shown in FIG. 2. Referring to FIG. 2, in the data storage system 2, a host 100 includes a host memory 110 and a lifetime estimator 120. The host memory 110 is a memory for storing data to be I/O requested to the storage device 200, and examples thereof may include a dynamic random access memory (DRAM), a static dynamic random access memory (SRAM) or a double data rate synchronous DRAM (DDR SDRAM). The lifetime estimator 120 receives the I/O requested data from the host memory 110 and estimates the received lifetime of the data. Here, the lifetime refers to a change period of data. In detail, the lifetime means, for example, a time interval from a data created time to a data deleted or nullified time, which will later be described with reference to FIG. 4. The host 100 transmits the I/O requested data and the lifetime information of the data to the storage device 200. For ease of explanation, in the following description, the I/O request is regarded as a request for the data to be stored in the storage device 200, but aspects of the present inventive concept are not limited thereto.

The controller 210 of the storage device 200 receives the storage requested data and the lifetime information of the data from the host 100 and determines a data storage position in the flash memory 220 based on the received lifetime information. Referring to FIG. 3, the controller 210 includes a processor 211, a host interface 212, a data placement manager 214, a local memory 215, and a flash memory interface 216. The components 211, 212, 214, 215 and 216 of the controller 210 may be electrically connected to one another through a bus.

The host interface 212 may perform interfacing between the storage device 200 including the controller 210 and the host 100. In particular, the host interface 212 may supply the storage requested data and the lifetime information of the data from the host 100 to the controller 210. In addition, the host interface 212 may supply a logical address, a command latch enable (CLE) signal, an address latch enable (ALE) signal, a ready/busy (R/B) signal, a chip enable (CE) signal, and so on, received from the host 100 to the controller 210. In addition, the host interface 212 may communicate with the host 100 by a predetermined protocol. For example, the predetermined protocol may be a universal serial bus(USB), a small computer system interface (SCSI), PCI express, ATA, parallel ATA (PATA), serial ATA (SATA), or serial attached SCSI (SAS), but aspects of the present inventive concept are not limited thereto.

The local memory 215 may include a read only memory (ROM) or a random access memory (RAM). The ROM may store firmware codes for driving the storage device 200, but aspects of the present inventive concept are not limited thereto. The firmware codes may be stored in a nonvolatile memory, for example, the flash memory 220, in addition to the ROM. Meanwhile, the RAM may function as a buffer memory and may store various commands or variables input through the host interface 212. In addition, the RAM may store data input to or output from the flash memory 220. Further, the RAM may store data, various parameters and variables input to or output from the flash memory 220.

The processor 211 can be implemented by a circuit, a logic, codes and combinations thereof and generally controls the operation of the storage device 200 including the controller 210. If power is applied to the storage device 200, the processor 211 drives firmware stored in the ROM for operating the processor 211 on the RAM, thereby controlling the overall operation of the storage device 200. In addition, the processor 211 may analyze a command received from the host interface 212 and may control the overall operation of the flash memory 220 according to the analysis result. In addition, the processor 211 may map a logical address supplied from the host 100 using an address mapping table to a physical address corresponding to the flash memory 220.

The flash memory interface 216 may exchange signals between the controller 210 and the flash memory 220. A command requested by the processor 211 may be supplied to the flash memory 220 through the flash memory interface 216, and data may be transmitted from the controller 210 to the flash memory 220. In addition, the data output from the flash memory 220 is supplied to the controller 210 through the flash memory interface 216.

The data placement manager 214 determines a storage position of the data in the flash memory 220 based on the data and the lifetime information of the data received through the host interface 212. The data placement manager 214 will later be described in detail with reference to FIGS. 6 and 7.

Figure 4:
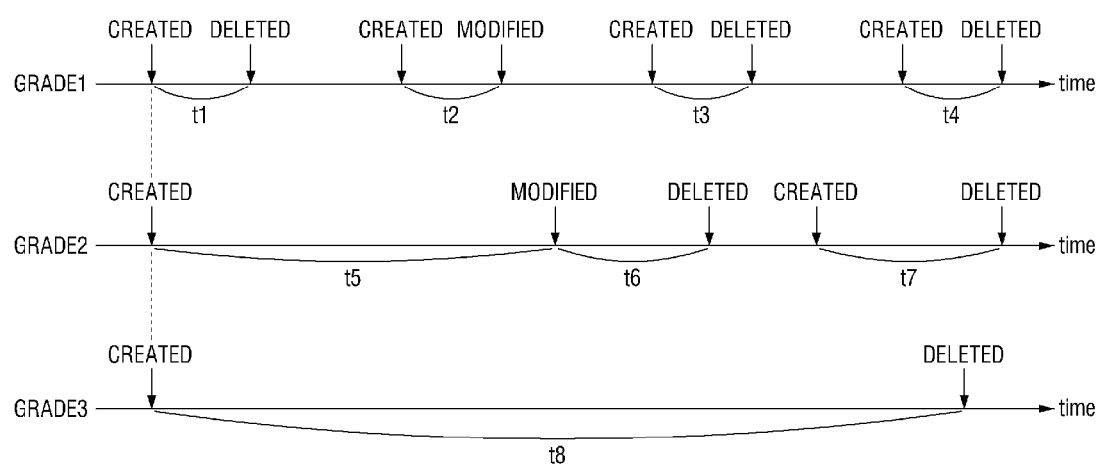
FIG. 4 is a conceptual diagram illustrating a lifetime of data.

FIG. 4 is a conceptual diagram illustrating a lifetime of data. Referring to FIG. 4, change periods of data having different types of lifetime according to the passage of time are illustrated. First, data corresponding to a first lifetime grade (GRADE 1) may be created and then deleted or modified with time intervals t1, t2, t3 and t4. Data corresponding to a second lifetime grade (GRADE 2) may be created and then deleted or modified with time intervals t5 and t7, which are both longer than each of t1, t2, t3 and t4. Accordingly, it is understood that the data corresponding to the second lifetime grade GRADE 2 has a longer change period than the data corresponding to the first lifetime grade GRADE 1. That is to say, the lifetime of the data corresponding to the second lifetime grade GRADE 2 is longer than that of the data corresponding to the first lifetime grade GRADE 1. A time interval t6 ranging from a data modified time to a data deleted time is also longer than each of the time intervals t1, t2, t3 and t4. Likewise, data corresponding to a third lifetime grade GRADE 3 is created and then deleted with a time interval t8, which is longer than each of the time intervals t1, t2, t3 and t4. Accordingly, it is understood that the data corresponding to the third lifetime grade GRADE 3 has a longer change period than the data corresponding to the second lifetime grade GRADE 2. That is to say, the lifetime of the data corresponding to the third lifetime grade GRADE 3 is longer than that of the data corresponding to the second lifetime grade GRADE 2.

The lifetime indicating a change period of data can be represented by lifetime grades produced by classifying the change period into N grades (N is a natural number) according to the length of the change period. Accordingly, data pieces, which have similar lifetimes while not having completely the same change period, may be classified into one group. For example, data changed every 1 hour and data changed every 1 hour 10 minutes may be classified as a first grade, data changed every 4 hours and data changed every 4 hours 40 minutes may be classified as a second grade, and data changed every 10 hours may be classified as a third grade. As the classification result, grade comparison may be performed, such that the lifetime of data of a first grade is shorter than that of data of a second grade and the lifetime of data of a third grade is longer than that of the data of the first grade In some embodiments of the present inventive concept, the lifetime grades may be determined as absolute grades of 1 to N. For example, when the change period of data is 0 second to 1 minute, the lifetime of the data may be determined as a first grade, when the change period of data is 1 minute to 10 minutes, the lifetime of the data may be determined as a second grade and when the change period of data is 10 minutes to 1 hour, the lifetime of the data may be determined as a third grade. In some embodiments of the present inventive concept, the lifetime grades may be determined such that data having a longer lifetime is classified as higher lifetime grade data, but aspects of the present inventive concept are not limited thereto. In addition, the lifetime grades may further include a permanent lifetime grade for the data that permanently exists in the flash memory, and an immeasurable lifetime grade for the data whose change period cannot be measured. Meanwhile, in some embodiments of the present inventive concept, the lifetime grades may be relatively determined based on lifetime grades of other data. For example, for first data determined to have a grade of a predetermined value, e.g., a third grade, another data may be determined to have a "higher grade than the first data", a "the same grade with the first data" or a "lower grade than the first data". Values of the lifetime of either an absolute grade or a relative grade can be represented in various manners using digits, characters, figures or combinations thereof, but aspects of the present inventive concept are not limited thereto.

Figure 5:
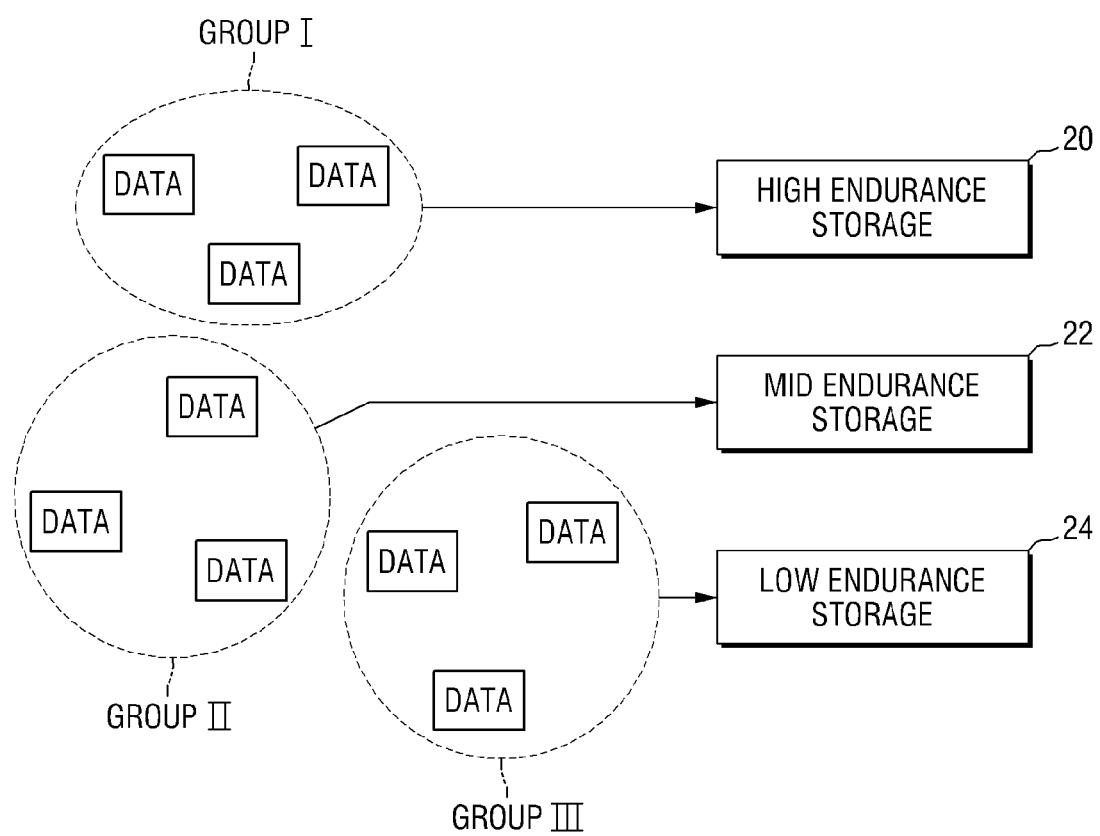
FIG. 5 is a conceptual diagram illustrating how data pieces having different lifetimes are placed in a storage device.

Referring to FIG. 5, a plurality of data pieces may be stored in, for example, a high endurance storage 20, a mid endurance storage 22 and a low endurance storage 24. Here, the high endurance storage 20 may have a longer lifetime than the mid endurance storage 22 and the low endurance storage 24. The mid endurance storage 22 has a shorter lifetime than the high endurance storage 20 but has a longer lifetime than the low endurance storage 24. The lifetime of a storage device may be affected by various factors. For example, the lifetime of a storage device may be affected by a lifetime of a memory cell included in the storage device. In this case, the lifetime of a memory cell, that is, the endurance of a memory cell, may be measured based on a maximum number of data I/O operations of the memory cell, e.g., a maximum number of erase operations. Based on the statistical data, endurance between memory cells, between memory modules including memory cells and between flash memories or storage devices including memory modules can be objectively compared.

Thus, when data pieces of a first group GROUP I have a shorter lifetime than data pieces of a second group GROUP II and the data pieces of a second group GROUP II have a shorter lifetime than data pieces of a third group GROUP III, the GROUP I data pieces are stored in the high endurance storage 20, the GROUP II data pieces are stored in the mid endurance storage 22, and the GROUP III data pieces are stored in the low endurance storage 24.

As described above, the data pieces are stored in various storage devices in a distributed manner in consideration of their lifetimes. That is to say, short-lifetime, frequently-changed data pieces, which noticeably increase a number of I/O operations, may be placed in a high endurance storage, and long-lifetime, not frequently-changed data pieces, which do not greatly increase a number of I/O operations, may be placed in a low endurance storage. With this data placement, the I/O operations may be distributed according to the endurance of a storage device, thereby improving performance of the storage device and extending a lifetime of the storage device.

Figure 6:
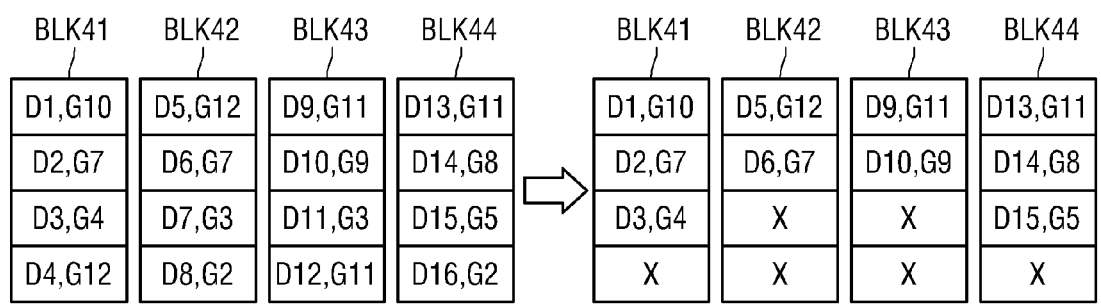
FIGS. 6 and 7 are conceptual diagrams illustrating how data pieces having different lifetimes are placed in flash memory blocks.
Figure 7:
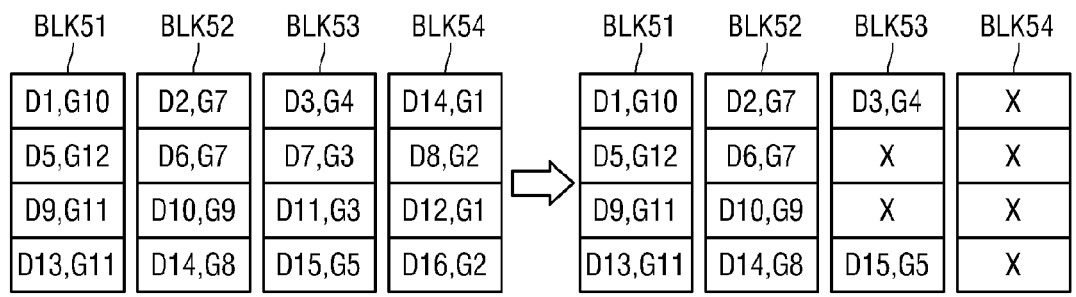

FIGS. 6 and 7 are conceptual diagrams illustrating data pieces having different lifetimes are placed in flash memory blocks.

The data placement manager 214 determines a storage position of the data in the flash memory 220 based on the data and the lifetime information of the data received through the host interface 212. As described above, the lifetime information may include lifetime grades produced by classifying the change period of the data into multiple grades according to the length of the change period. The data placement manager 214 may store only the data having the same lifetime grade in a memory block of the flash memory 220. Referring to FIG. 6, for example, data D5 having a lifetime 'G12', data D6 having a lifetime 'G7', data D7 having a lifetime 'G3' and data D8 having a lifetime 'G2' are stored in a block BLK42. In this case, assuming that the data pieces D7 and D8 having a relatively short lifetime are nullified, since the data pieces D5 and D6 that are valid still exist in the block BLK42, the block BLK42 cannot be immediately erased or garbage collection may not be performed on the block BLK42. In order to perform garbage collection, the data pieces D5 and D6 existing in the block BLK42 should be migrated. That is to say, additional I/O operations are necessarily performed.

By contrast, referring to FIG. 7, data D14 having a lifetime 'G1', data D8 having a lifetime 'G2', data D12 having a lifetime 'G1' and data D16 having a lifetime 'G2' are stored in, for example, a block BLK54. That is to say, the data placement manager 214 treats 'G1' and 'G2' as the same grade and places the data pieces having the lifetimes 'G1' and 'G2' in one memory block BLK54. In this case, all of the data pieces D4, D8, D12 and D16 are nullified at roughly the same time, the block BLK54 can be immediately erased or garbage collection may be performed on the block BLK54. In some embodiments of the present inventive concept, garbage collection may be preferentially performed on a block having a relatively short lifetime. Therefore, the performance of a storage device can be improved and a lifetime of the storage device can be extended by reducing the number of I/O operations.

Figure 8:
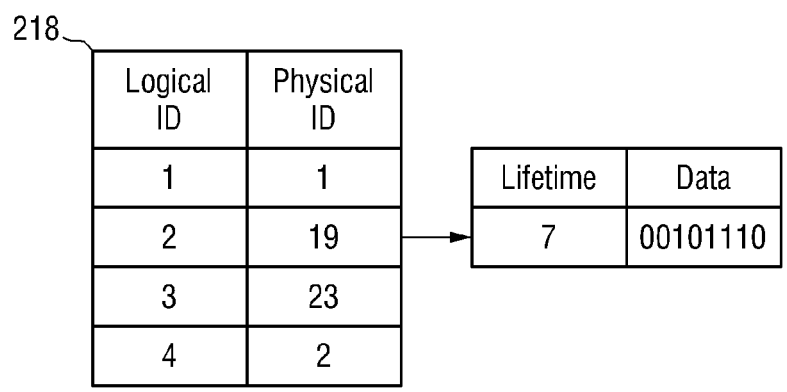
FIGS. 8 and 9 are diagrams illustrating how the lifetime of data is managed by metadata.
Figure 9:
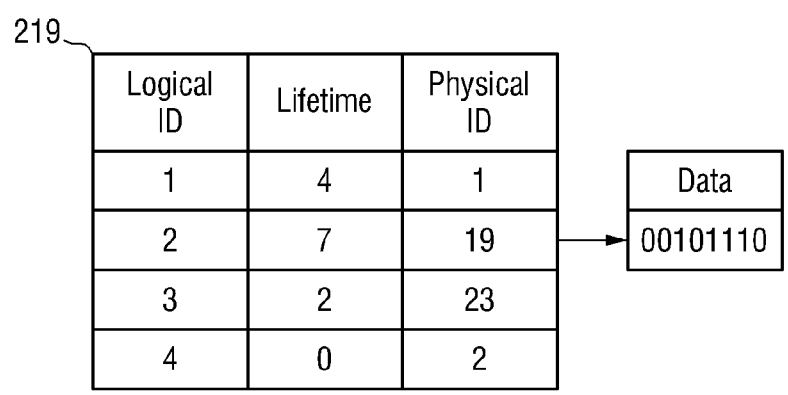

FIGS. 8 and 9 are diagrams illustrating how the lifetime of data is managed by metadata. Referring to FIGS. 8 and 9, the controller 210 may further include a metadata management unit managing metadata indicating a relationship between the data and the lifetime information. For example, assumptions are made that data '00101110' is stored in a data block identified by a logical address '2' and a physical address '19' and a lifetime of the data is '7'. In some embodiments of the present inventive concept, the lifetime may be stored as a record (lifetime, data) connected to a record of a mapping table 218 for mapping logical addresses and physical addresses of the flash memory 220 through a link. Meanwhile, in some embodiments of the present inventive concept, lifetimes may be stored as some of records of a mapping table 219 for mapping logical addresses and physical addresses of the flash memory 220, and the records may include links indicating data cone sponding to the lifetime. The metadata management unit may manage the metadata using a data format or database.

FIG. 10 illustrates how data pieces are placed in blocks of a flash memory according to lifetimes in the same or substantially the same range. Referring to FIG. 10, four data pieces each having a lifetime '1' are stored in a block '1' and four data pieces each having a lifetime '0' are stored in a block '3'. Meanwhile, four data pieces each having a lifetime '3' or '4' are stored in a block '2' and four data pieces each having a lifetime '8' or '9' are stored in a block '4'. In some embodiments of the present inventive concept, the placement unit 214 determines a storage position of data such that the short-life data is placed at a place having a smallest wear-leveling count in the flash memory. That is to say, the short-life data and I/O operations frequently performed thereon may be placed at a place having a small wear level, i.e., a small deterioration extent, thereby reducing a deterioration speed.

Meanwhile, when the lifetime information of the data stored in the flash memory 220 is changed, the data placement manager 214 determines again the storage position of the data based on the changed lifetime information. In detail, when the flash memory 220 includes a first memory block and a second memory block and the lifetime information of the data stored in the first memory block is changed, the data may be migrated to the second memory block. In some embodiments of the present inventive concept, the changed lifetime information may be received from the host 100. With this data placement, the number of I/O operations of data is reduced, thereby improving performance of the flash memory cell or the flash memory and extending the lifetime thereof.

Figure 11:
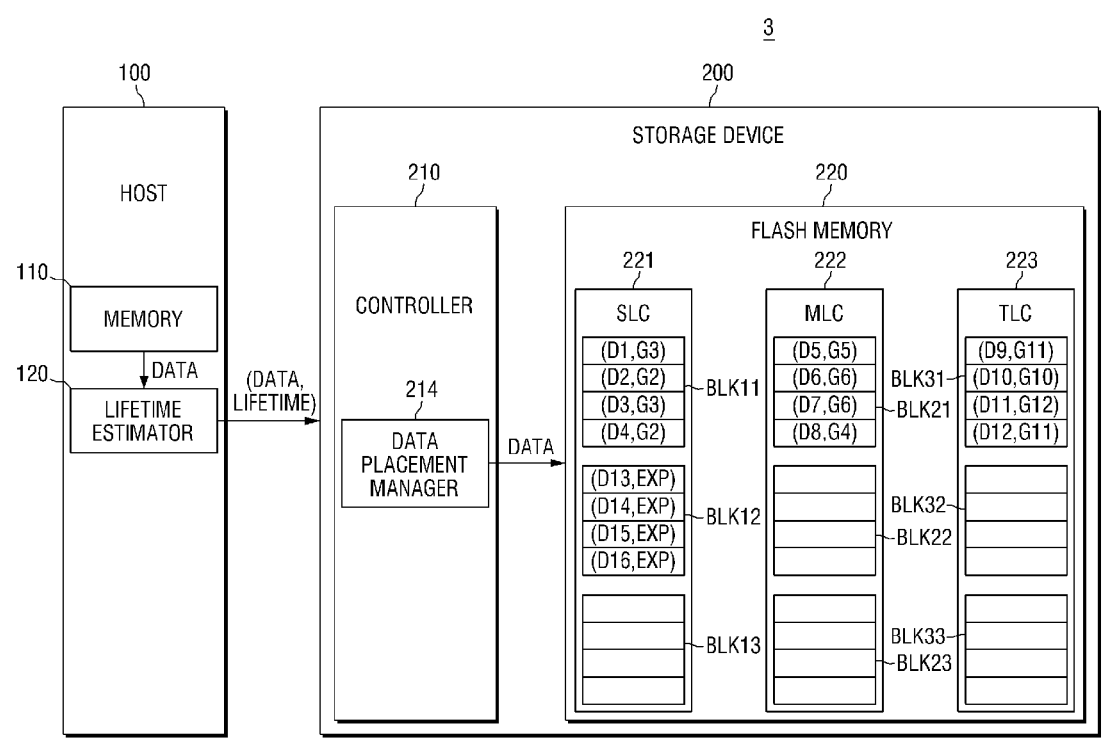
FIG. 11 is a schematic diagram of a data storage system according to still another embodiment of the present inventive concept.
Figure 12:
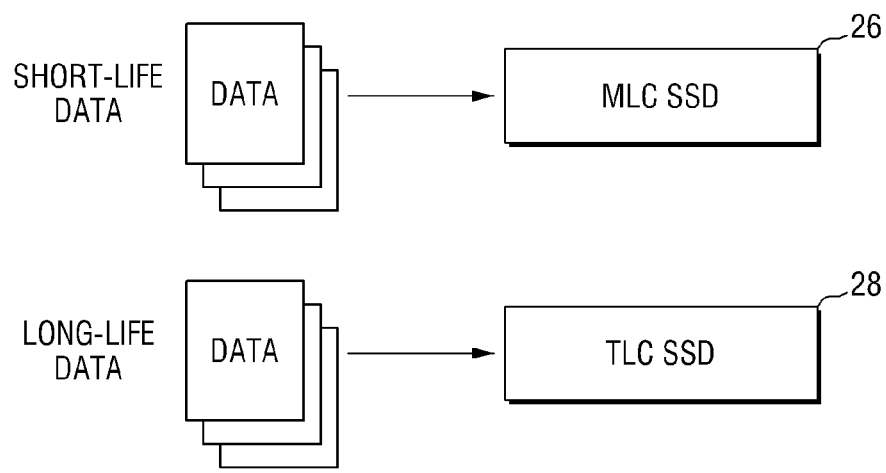
FIG. 12 is a conceptual diagram illustrating how data pieces having different lifetimes in the data storage system shown in FIG. 11 are placed in a storage device.

FIG. 11 is a schematic diagram of a data storage system according to still another embodiment of the present inventive concept, and FIG. 12 is a conceptual diagram illustrating data pieces having different lifetimes in the data storage system shown in FIG. 11 are placed in a storage device.

The data storage system 3 shown in FIG. 11 is different from the data storage system 2 shown in FIG. 2 in that a flash memory 220 includes a plurality of memory modules 221, 222 and 223. In some embodiments of the present inventive concept, the first memory module 221 may include a single level cell (SLC) memory module, the second memory module 222 may be a multiple level cell (MLC) memory module, and the third memory module 223 may be a triple level cell (TLC). Here, the MLC may include a triple level cell (TLC) or a quad level cell (QLC). There may be a difference in the endurance between the SLC and the MLC. In general, an SLC memory has longer endurance than an MLC memory, so that it has a longer lifetime than the MLC memory. The endurance of the memory module may be measured based on a maximum number of I/O operations of the memory cell.

The data placement manager 214 may determine the storage position of data from the first memory module 221 and the second memory module 222 based on the lifetime information received from the host 100. Here, when the lifetime of the data exceeds a predetermined critical value, the data placement manager 214 determines the second memory module 222, that is, the MLC memory module, as the storage position of the data. When the lifetime of the data is less than the predetermined critical value, the data placement manager 214 determines the first memory module 221, that is, the SLC memory module, as the storage position of the data. As described above, the data pieces each having a relatively short lifetime are stored in the SLC memory module having relatively high endurance and the data pieces each having a relatively long lifetime are stored in the MLC memory module having relatively low endurance, thereby distributing I/O operations occurring in the flash memory according to the characteristic of a memory module. With this data placement, the number of I/O operations of data is reduced, thereby improving performance of the flash memory cell or the flash memory and extending a lifetime of the flash memory cell or the flash memory.

Referring to FIG. 12, short-life data may be stored in a first type storage device 26 employing an MLC memory, i.e., MLC SSD, and long-life data may be stored in a second type storage device 28 employing a TLC memory, i.e., TLC SSD. There may be a difference in the endurance between the MLC memory and the TLC memory. In general, the MLC memory has higher endurance than the TLC memory, so that it has a longer lifetime than the TLC memory. The endurance of a memory module may be measured based on a maximum number of data I/O operations of a memory cell. As described above, the data pieces each having a relatively short lifetime are stored in the storage device employing the MLC memory having relatively high endurance and the data pieces each having a relatively long lifetime are stored in the storage device employing the TLC memory having relatively low endurance, thereby distributing I/O operations occurring in the flash memory according to the characteristic of a storage device. With this data placement, the number of I/O operations of data is reduced, thereby improving performance of the storage device and extending a lifetime of the storage device.

Figure 13:
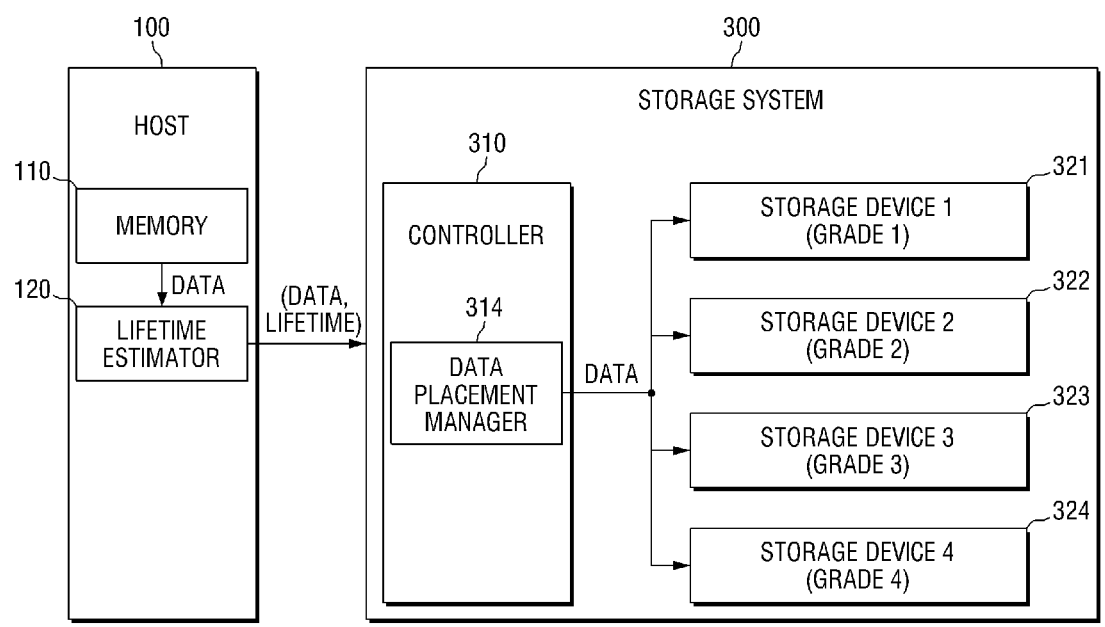
FIG. 13 is a schematic diagram of a data storage system according to still another embodiment of the present inventive concept.

FIG. 13 is a schematic diagram of a data storage system according to still another embodiment of the present inventive concept. The data storage system 4 shown in FIG. 13 is different from the data storage system 2 shown in FIG. 2 in that it employs a storage system 300 including a plurality of storage devices 321, 322, 323 and 324, instead of the storage device 200. In the data storage system 4 shown in FIG. 13, the storage system 300 includes a controller 310 and a plurality of storage devices 321, 322, 323 and 324. The controller 310 controls the plurality of storage devices 321, 322, 323 and 324 and includes a data placement manager 314 placing storage requested data received from a host 100 in the plurality of storage devices 321, 322, 323 and 324.

Here, there may be a difference in the endurance between each of the plurality of storage devices 321, 322, 323 and 324. In some embodiments of the present inventive concept, the first storage device 321 may include a first type memory cell, and the first type memory cell may be an SLC. The second storage device 322 may include a second type memory cell, and the second type memory cell may be an MLC. Accordingly, when consideration is taken into a lifetime of a memory cell used in a storage node, the first storage device 321 may have higher endurance than the second storage device 322. In various embodiments of the present inventive concept, the difference in the endurance between each of the plurality of storage devices 321, 322, 323 and 324 may be determined by various factors other than a factor associated with the memory cell.

The data placement manager 314 determines a storage position of data among the plurality of storage devices 321, 322, 323 and 324 based on storage requested data and lifetime information of the data received from the host 100. In this case, the data placement manager 314 may place data such that the lifetime of the data stored in the first storage device 321 is shorter than that of the data stored in the second storage device 322. For example, data pieces having a lifetime of a first grade (GRADE 1) may be placed in the storage device 321, data pieces having a lifetime of a second grade (GRADE 2) may be placed in the storage device 322, data pieces having a lifetime of a third grade (GRADE 3) may be placed in the storage device 323, and data pieces having a lifetime of a fourth grade (GRADE 4) may be placed in the storage device 324. In such a manner, the data pieces each having a relatively short lifetime is stored in a relatively high endurance storage device and the data pieces each having a relatively long lifetime is stored in a relatively low endurance storage device, thereby distributing I/O operations occurring in the flash memory according to the characteristic of the storage device. With this data placement, the number of I/O operations of data is reduced, thereby improving performance of the storage device and extending the lifetime thereof.

Figure 14:
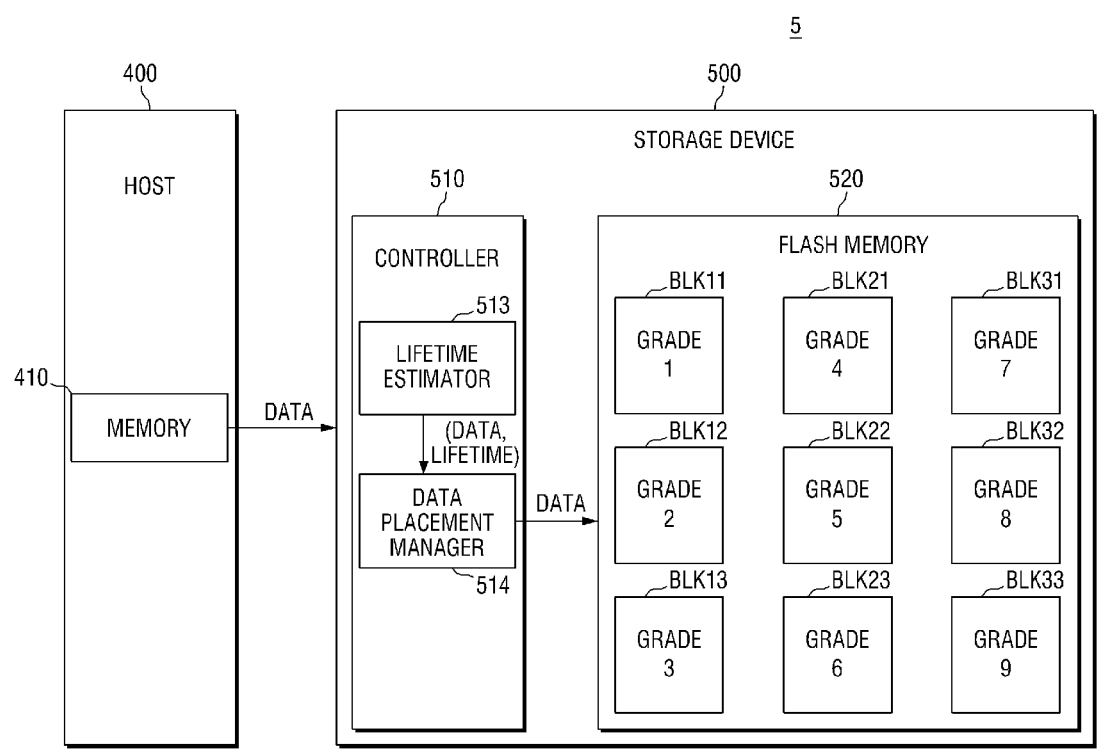
FIG. 14 is a schematic diagram of a data storage system according to still another embodiment of the present inventive concept.
Figure 15:
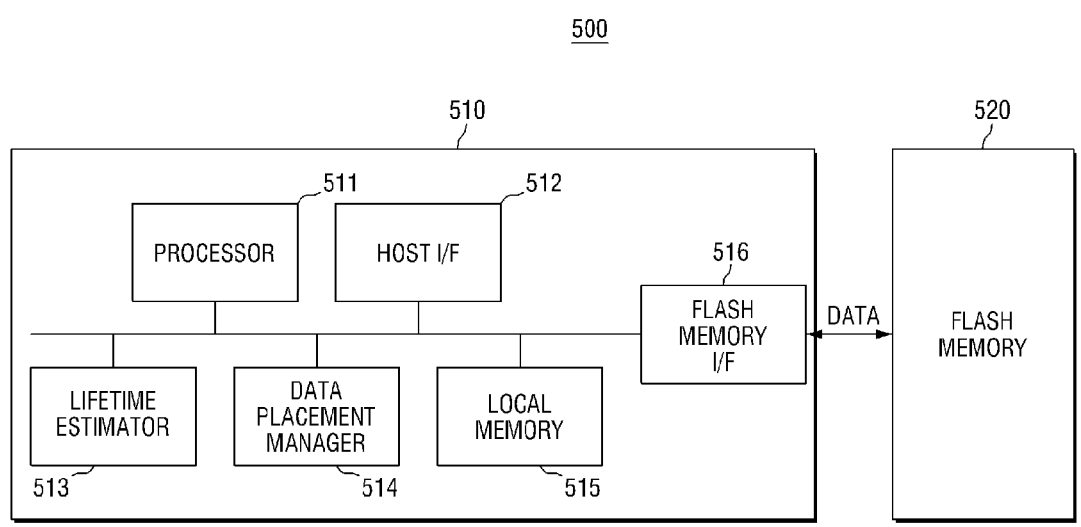
FIG. 15 is a schematic diagram of a controller shown in FIG. 14.

FIG. 14 is a schematic diagram of a data storage system according to still another embodiment of the present inventive concept and FIG. 15 is a schematic diagram of a controller shown in FIG. 14. The data storage system 5 shown in FIG. 14 is different from the data storage system 2 shown in FIG. 2 in that a host 400 transmits storage requested data to a storage device 500 and the storage device 500 directly estimates the lifetime of data for data displacement. In the data storage system 5, the host 400 may include a host memory 410 storing data for transmitting an input/output request to the storage device 500. Meanwhile, the storage device 500 may include a controller 510 and a flash memory 520, and the controller 510 may include a lifetime estimator 513.

Referring to FIG. 15, the lifetime estimator 513 may be electrically connected to other components of the controller 510, including a processor 511, a host interface 512, a data placement manager 514, a local memory 515 and a flash memory interface 516 through a bus. The lifetime estimator 513 directly estimates the lifetime of the data received through the host interface 512 and transmits the estimated lifetime to the data placement manager 514. The estimation of lifetime may be performed in the above-described manner in connection with the lifetime estimator 213 of the host 100. In some embodiments of the present inventive concept, the lifetime estimator 513 may re-estimate the lifetime of the data according to a snapshot, clone or deduplication operation. In addition, in some embodiments of the present inventive concept, the lifetime estimator 513 may employ a Heuristic method in estimating the lifetime of the data.

Figure 16:
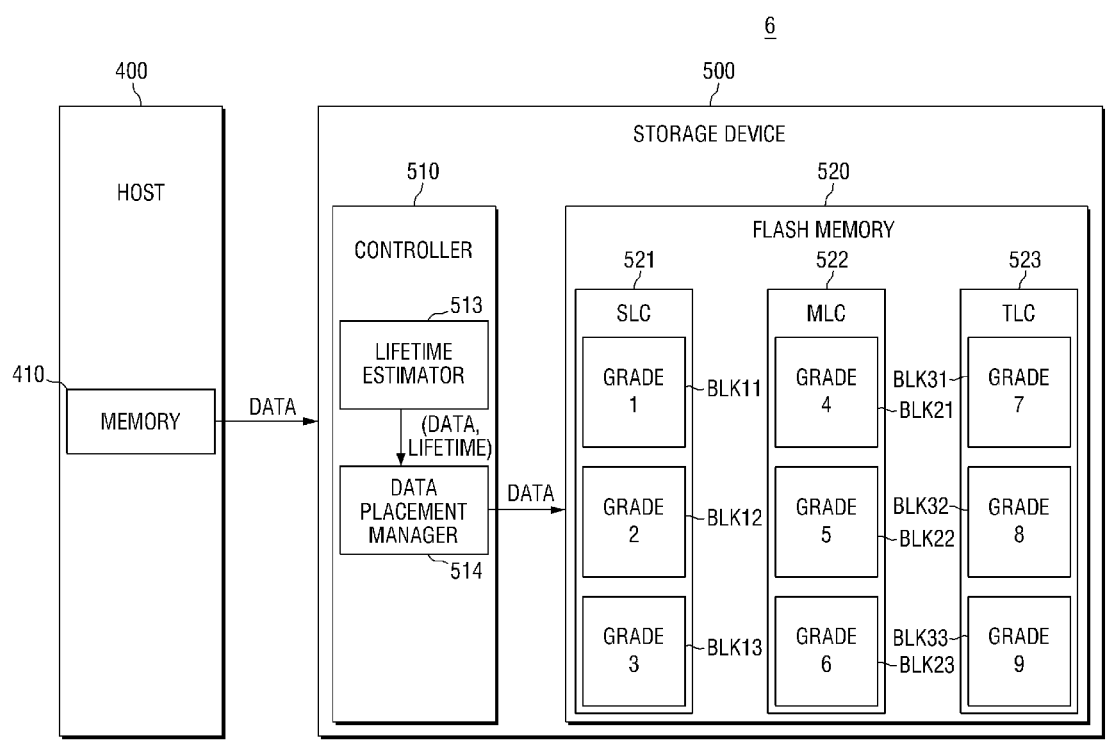
FIG. 16 is a schematic diagram of a data storage system according to still another embodiment of the present inventive concept.

FIG. 16 is a schematic diagram of a data storage system according to still another embodiment of the present inventive concept. The data storage system 6 shown in FIG. 16 is different from the data storage system 5 shown in FIG. 14 in that a flash memory 520 includes a plurality of memory modules 521, 522 and 523. In some embodiments of the present inventive concept, the first memory module 521 may be a single level cell (SLC) memory module, the second memory module 522 may be a multiple level cell (MLC) memory module, and the third memory module 523 may be a triple level cell (TLC) memory module. Here, the MLC may include a triple level cell (TLC) or a quad level cell (QLC).

The data placement manager 514 may determine a storage position of data from a first memory module 521 and a second memory module 522 based on lifetime information received from a lifetime estimator 513. Here, when the lifetime of the data exceeds a predetermined critical value, the data placement manager 514 may determine the second memory module 522, that is, an MLC memory module, as the storage position of the data. When the lifetime of the data is lower than the predetermined critical value, the data placement manager 514 may determine the first memory module 521, that is, an SLC memory module. As described above, the data pieces each having a relatively short lifetime are stored in the SLC memory module having relatively high endurance and the data pieces each having a relatively long lifetime are stored in the MLC memory module having relatively low endurance, thereby distributing I/O operations occurring in the flash memory according to the characteristic of a memory module. With this data placement, the number of I/O operations of data is reduced, thereby improving performance of the flash memory cell or the flash memory and extending a lifetime of the flash memory cell or the flash memory.

Figure 17:
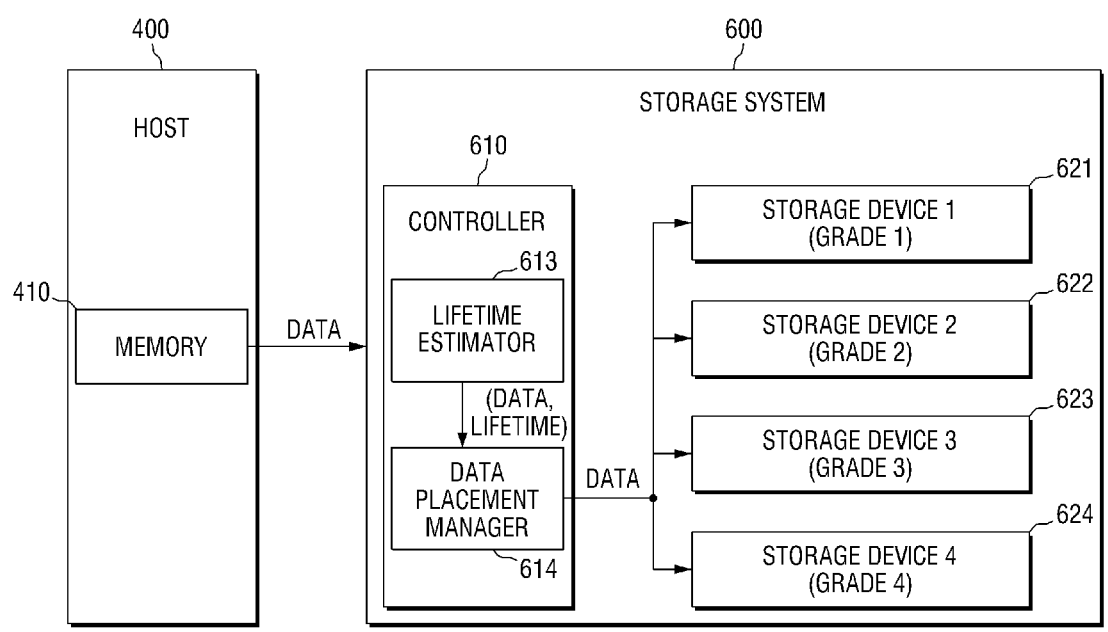
FIG. 17 is a schematic diagram of a data storage system according to still another embodiment of the present inventive concept.

FIG. 17 is a schematic diagram of a data storage system according to still another embodiment of the present inventive concept. The data storage system 7 shown in FIG. 17 is different from the data storage system 5 shown in FIG. 14 in that it employs a storage system 600 including a plurality of storage devices 621, 622, 623 and 624, instead of the storage device 500 in the data storage system 5 shown in FIG. 14. In the data storage system 7 shown in FIG. 17, the storage system 600 includes a controller 610 and the plurality of storage devices 621, 622, 623 and 624. The controller 610 controls the plurality of storage devices 621, 622, 623 and 624 and includes a lifetime estimator 613 estimating lifetime of storage requested data received from a host 400, and a data placement manager 614 placing data in the plurality of storage devices 621, 622, 623 and 624 based on the lifetime.

As described above, there may be a difference in the endurance between each of the plurality of storage devices 621, 622, 623 and 624 due to types of the memory cells used in the storage devices and other factors. The data placement manager 614 determines a storage position of data among the plurality of storage devices 621, 622, 623 and 624 based on the storage requested data from the host 400 and the lifetime information estimated by the lifetime estimator 613. Data pieces each having a relatively short lifetime are stored in the storage device having relatively high endurance and data pieces each having a relatively long lifetime are stored in the storage device having relatively low endurance, thereby distributing I/O operations occurring in the flash memory according to the characteristic of a storage device. With this data placement, the number of I/O operations of data is reduced, thereby improving performance of the storage device and extending a lifetime of the storage device.

Figure 18:
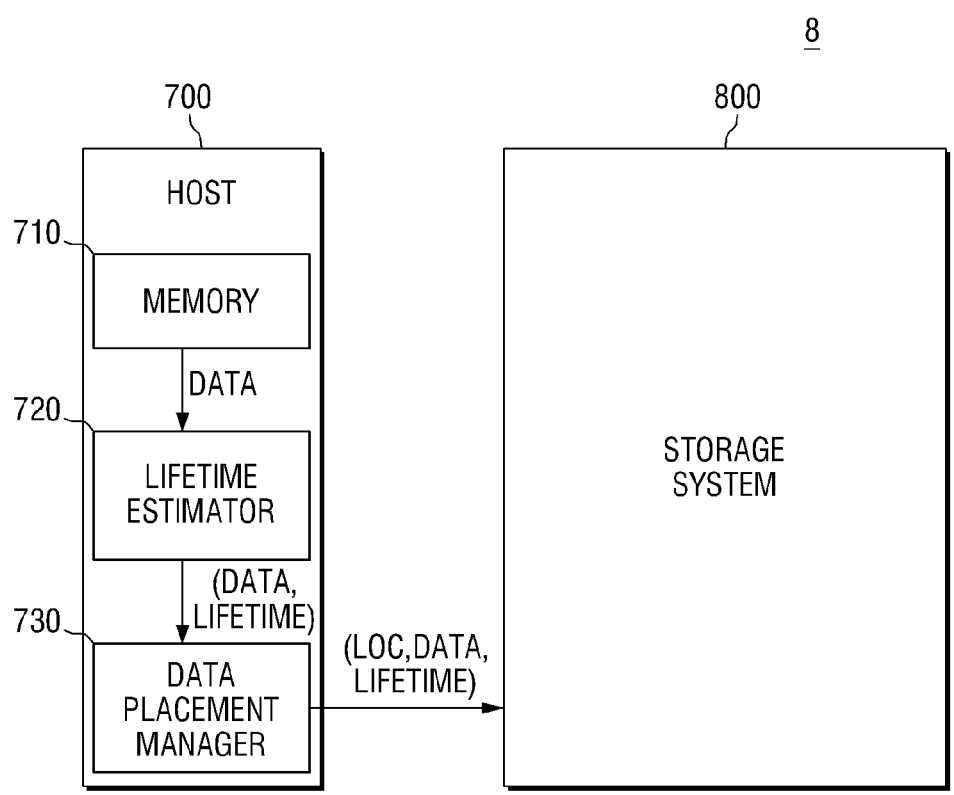
FIG. 18 is a schematic diagram of a data storage system according to still another embodiment of the present inventive concept.

FIG. 18 is a schematic diagram of a data storage system according to still another embodiment of the present inventive concept. Referring to FIG. 18, the data storage system 8 includes a host 700 and a storage system 800. The data storage system 8 shown in FIG. 18 is different from the data storage systems according to the previous embodiments in that the host 700 further includes a data placement manager 730 in addition to a host memory 710 and a lifetime estimator 720. That is to say, the host 700 transmits the data and the storage position of the data to the storage system 800 to allow the storage system 800 to store the data at a particular position.

As described above with reference to FIG. 2, the host memory 710 is a memory for storing data for I/O operations in the storage system 800. The lifetime estimator 720 receives I/O requested data from the host memory 710 and estimates the received lifetime of the data. The data placement manager 730 determines the storage position of the data in the storage system 800 based on the lifetime information received from the lifetime estimator 720. In the present embodiment, the storage system 800 may be the aforementioned storage device or a storage system including a plurality of storage devices.

Figure 19:
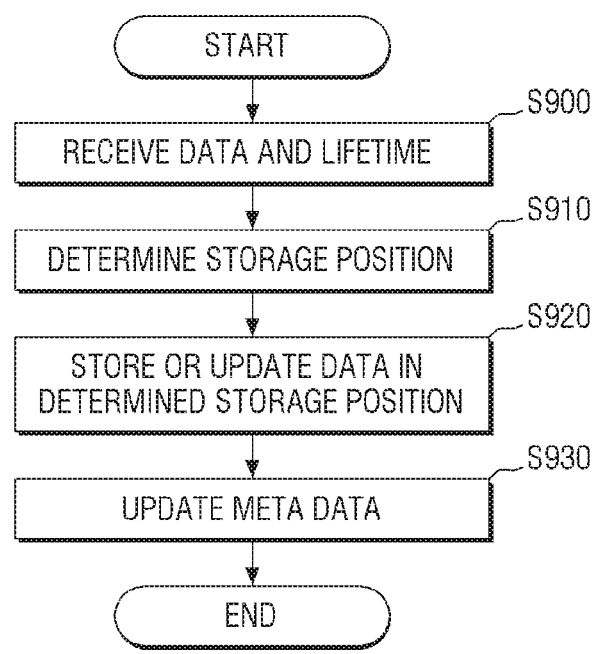
FIG. 19 is a flowchart for explaining a method of operating a storage controller according to an embodiment of the present inventive concept.

FIG. 19 is a flowchart for explaining a method of operating a storage controller according to an embodiment of the present inventive concept. Referring to FIG. 19, the method of operating a storage controller according to an embodiment of the present inventive concept includes receiving storage requested data from a host and lifetime information indicating a change period of the data (S900), and determining a storage position of the data in a flash memory based on the lifetime information of the data (S910). In addition, the operating method may further include storing the data at the determined storage position or updating the data stored at the storage position (S920), and updating metadata, such as lifetime information or address mapping information (S930).

Figure 20:
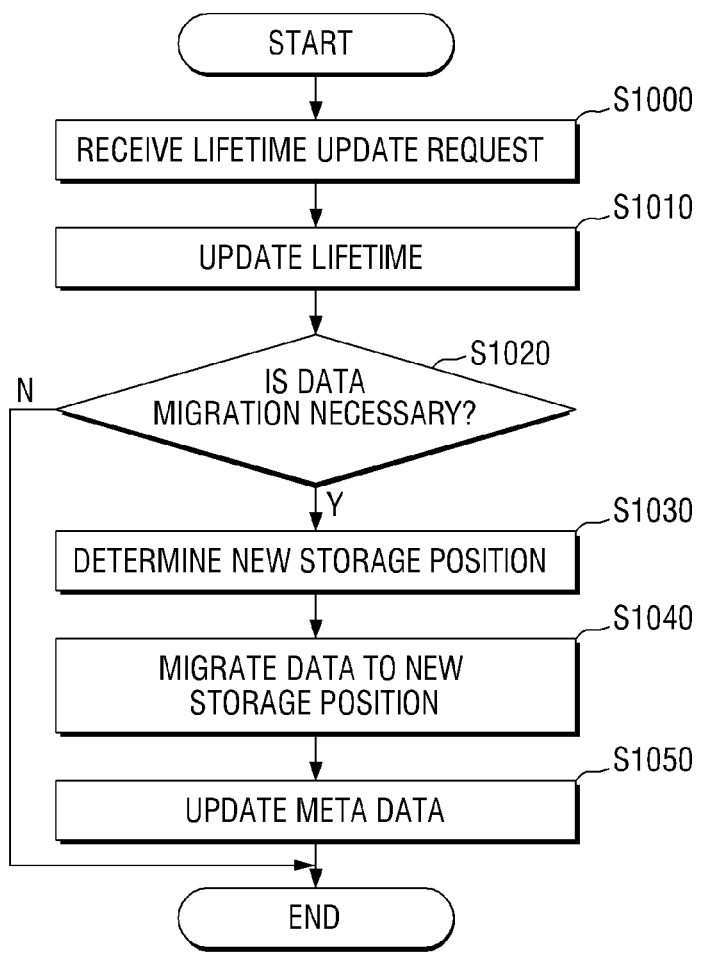
FIG. 20 is a flowchart for explaining a method of operating a storage controller according to another embodiment of the present inventive concept.

FIG. 20 is a flowchart for explaining a method of operating a storage controller according to another embodiment of the present inventive concept. Referring to FIG. 20, the method of operating a storage controller according to another embodiment of the present inventive concept includes receiving a lifetime update request of data stored in a flash memory (S1000), and updating old lifetime information according to new lifetime information (S1010). In addition, the operating method may further include determining whether data migration to another storage position is necessary due to a change in the lifetime grade as the updating result of the lifetime information (S1020), determining a new storage position in the flash memory if the data migration is necessary (S1030), migrating data to the new storage position (S1040), and updating meta data, such as lifetime information or address mapping information (S1050).

Figure 21:
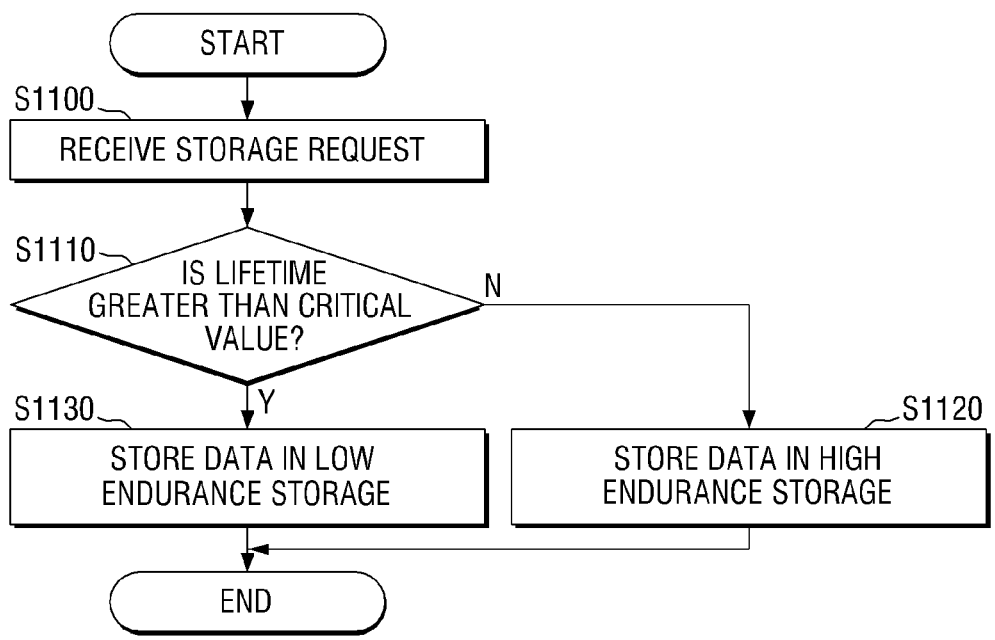
FIG. 21 is a flowchart for explaining a method of operating a storage controller according to still another embodiment of the present inventive concept.

FIG. 21 is a flowchart for explaining a method of operating a storage controller according to still another embodiment of the present inventive concept. Referring to FIG. 21, the method of operating a storage controller according to still another embodiment of the present inventive concept includes receiving storage requested data and information on a lifetime indicating a change period of the data from a host (S1100), comparing the lifetime with a predetermined critical value (S1110), if the lifetime does not exceed the predetermined critical value, storing the data in a high endurance storage (S1120), and if the lifetime exceeds the predetermined critical value, storing the data in a low endurance storage (S1130).

Figure 22:
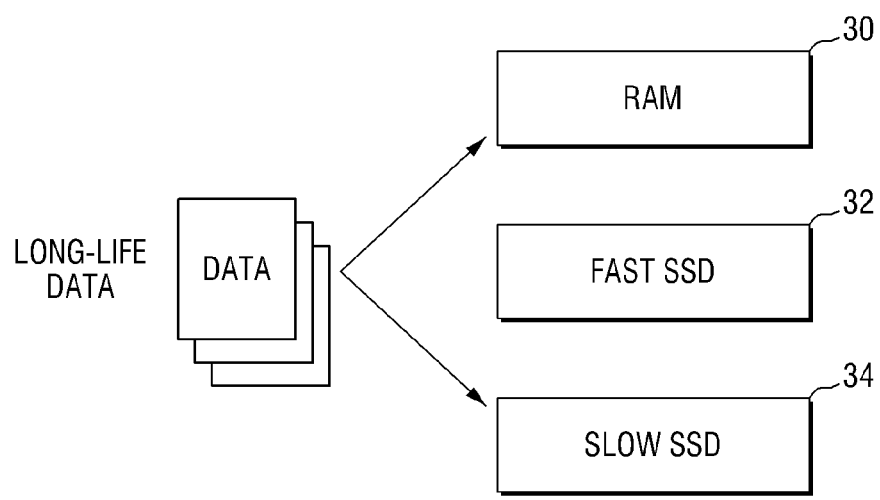
FIG. 22 is a conceptual diagram illustrating how data stored in a storage device is additionally stored in a cache.

FIG. 22 is a conceptual diagram illustrating how data stored in a storage device is additionally stored in a cache, and FIG. 23 is a flowchart for explaining a method of operating a storage controller according to still another embodiment of the present inventive concept. Referring to FIG. 22, the storage systems according to the previous embodiments of the present inventive concept may further include a cache memory 30 for caching data stored in a plurality of storage devices, and a controller of each storage system may load the data stored in the plurality of storage devices to the cache memory 30.

The plurality of storage devices may include a fast storage device 32 and a slow storage device 34. For example, the slow storage device 34 may have a lower data I/O rate than the fast storage device 32, and a lifetime stored in the slow storage device 34 may be shorter than that stored in the fast storage device 32. When a number of access frequencies to the data stored in the slow storage device 34 per unit time exceeds a predetermined critical value, the controller may perform caching by loading the data having the number of access frequencies to the cache memory.

Referring to FIG. 23, the method of operating a storage controller according to still another embodiment of the present inventive concept includes receiving storage requested data and information on a lifetime indicating a change period of the data from a host (S1200), comparing the lifetime with a first critical value (S1210), if the lifetime does not exceed the first critical value, storing the data in a high endurance storage (S1220), and if the lifetime exceeds the first critical value, storing the data in a low endurance storage (S1230). Next, the operating method may include comparing a number of access frequencies of data stored in a low endurance storage with a second critical value (S1240), and if the number of access frequencies exceeds the second critical value, additionally storing the data in a cache (S1250).

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A storage controller comprising:
   a host interface configured to receive data requested for storage from a host, and receive lifetime information indicating a change period of the data; and
   a data placement manager configured to determine a storage position of the data in a flash memory based on the lifetime information of the data.

2. The storage controller of claim 1, wherein the lifetime information includes lifetime grades produced by classifying the change period of the data into N grades, where N is a natural number, according to a length of the change period, and wherein the data placement manager is configured to determine a storage position of first data pieces from among the data having a same lifetime grade in a corresponding memory block.

3. The storage controller of claim 2, wherein the lifetime grades are determined as absolute grades of 1 to N.

4. The storage controller of claim 3, wherein the lifetime grades are determined such that second data pieces from among the data having a longer lifetime have a higher lifetime grade than other data pieces from among the data.

5. The storage controller of claim 3, wherein the lifetime grades further include a permanent lifetime grade for second data pieces from among the data that permanently exist in the flash memory.

6. The storage controller of claim 2, wherein lifetime grades of data pieces from among the data are determined relative to lifetime grades of other data pieces from among the data.

7. The storage controller of claim 1, wherein the data placement manager is configured to determine a storage position of first data pieces from among the data having a relatively short lifetime as compared to a lifetime of other data pieces from among the data as placed at a place in the flash memory having a relatively smaller wear-leveling count than other places in the flash memory.

8. The storage controller of claim 1, wherein the flash memory includes a first storage position and a second storage position, and
when a lifetime of the first storage position is shorter than a lifetime of the second storage position, a garbage collection operation is preferentially performed on the first storage position.

9. The storage controller of claim 1, wherein when the lifetime information of the data stored in the flash memory is changed to provide changed lifetime information, the data placement manager is configured to again determine the storage position of the data based on the changed lifetime information.

10. The storage controller of claim 9, wherein the flash memory includes a first memory block and a second memory block, and when the lifetime information of the data stored in the first memory block is changed to provide the changed lifetime information, the data is migrated to the second memory block.

11. The storage controller of claim 9, wherein the changed lifetime information is received from the host.

12. The storage controller of claim 1, further comprising a lifetime estimator configured to estimate a lifetime of the data received from the host, and transmit the estimated lifetime to the data placement manager as the lifetime information.

13. The storage controller of claim 12, wherein the lifetime estimator is configured to re-estimate the lifetime of the data according to at least one of a snapshot, clone and deduplication operation.

14. The storage controller of claim 12, wherein the lifetime estimator is configured to use a Heuristic method to estimate the lifetime of the data.

15. The storage controller of claim 1, further comprising a metadata management unit configured to manage metadata indicating a relationship between the data and the lifetime information.

16. A storage device comprising:
a flash memory including a single level cell (SLC) memory module and a multiple level cell (MLC) memory module;
a flash memory interface configured to interface with the flash memory;
a host interface configured to receive data requested for storage from a host, and receive lifetime information indicating a change period of the data; and
a data placement manager configured to determine a storage position of the data in the flash memory within the SLC memory module and the MLC memory module based on the lifetime information of the data.

17. The storage device of claim 16, wherein when a lifetime of the data exceeds a predetermined threshold value, the data placement manager determines the MLC memory module as the storage position of the data.

18. The storage device of claim 16, wherein an endurance of the MLC memory module is higher than an endurance of the SLC memory module.

19. The storage device of claim 18, wherein the endurance of the SLC memory module and the endurance of the MLC memory module are measured based on a maximum number of data I/O operations of memory cells within the SLC memory module and the MLC memory module.

20. The storage device of claim 18, wherein a lifetime of first data pieces from among the data that is stored in the SLC memory module is shorter than a lifetime of second data pieces from among the data that is stored in the MLC memory module.

21. The storage device of claim 16, wherein the MLC memory module includes at least one of a triple level cell (TLC) and a quad level cell (QLC).

22. A storage system comprising:
a plurality of storage devices; and
a controller configured to control the plurality of storage devices,
the controller comprising
a host interface configured to receive data requested for storage from a host, and receive lifetime information indicating a change period of the data, and
a data placement manager configured to determine a storage position of the data in a flash memory among the plurality of storage devices based on the lifetime information of the data.

23. The storage system of claim 22, wherein each of the plurality of storage devices include a first storage device including a memory cell of a first type and a second storage device including a memory cell of a second type different from the first type, and wherein an endurance of the first storage device is higher than an endurance of the second storage device.

24. The storage system of claim 23, wherein a lifetime of first data pieces from among the data that is stored in the first storage device is shorter than a lifetime of second data pieces from among the data that is stored in the second storage device.

25. The storage system of claim 22, further comprising a cache memory configured to cache the data stored in the plurality of storage devices, wherein the controller is configured to load the data stored in the plurality of storage devices to the cache memory.

26. The storage system of claim 25, wherein the plurality of storage devices include a first storage device and a second storage device, a data I/O rate of the second storage device is lower than a data I/O rate of the first storage device, and a lifetime of first data pieces from among the data that is stored in the first storage device is shorter than a lifetime of second data pieces from among the data that is stored in the second storage device.

27. The storage system of claim 26, wherein when access frequencies to the second data pieces stored in the second storage device per unit time exceed a predetermined threshold value, the controller is configured to load the second data pieces having the access frequencies exceeding a predetermined threshold frequency to the cache memory.

* * * * *